United States Patent

Mizuno

[11] Patent Number: 6,157,451
[45] Date of Patent: Dec. 5, 2000

[54] SAMPLE CD MEASUREMENT SYSTEM

[75] Inventor: Fumio Mizuno, Tokorozawa, Japan

[73] Assignee: Hitachi, Ltd., Tokyo, Japan

[21] Appl. No.: 09/316,962

[22] Filed: May 24, 1999

Related U.S. Application Data

[63] Continuation of application No. 08/859,542, May 20, 1997.
[51] Int. Cl.$^7$ .................................................. G01B 11/00
[52] U.S. Cl. ........................... 356/394; 388/372; 388/393
[58] Field of Search .................................... 356/394, 388, 356/343, 372

[56] References Cited

U.S. PATENT DOCUMENTS 3,736,063  5/1973  Ohno et al. ............................. 356/394

*Primary Examiner*—Frank G. Font
*Assistant Examiner*—Reginald A. Ratliff
*Attorney, Agent, or Firm*—Kenyon & Kenoyn

[57] ABSTRACT

A sample CD measurement system adapted for measuring the CD of a measurement portion accurately even in the case where the shape of the measurement portion and the direction of measurement are arbitrary. Before the CD measurement, a measurement reference image corresponding to the measurement portion is registered in a computer and controller. At the time of the CD measurement, the measurement reference image is read and compared with an image of the measurement portion to thereby obtain a difference in shape between the image of the measurement portion and the measurement reference image on the basis of a result of the comparison to thereby obtain the CD of the measurement portion on the basis of the difference in shape.

34 Claims, 5 Drawing Sheets

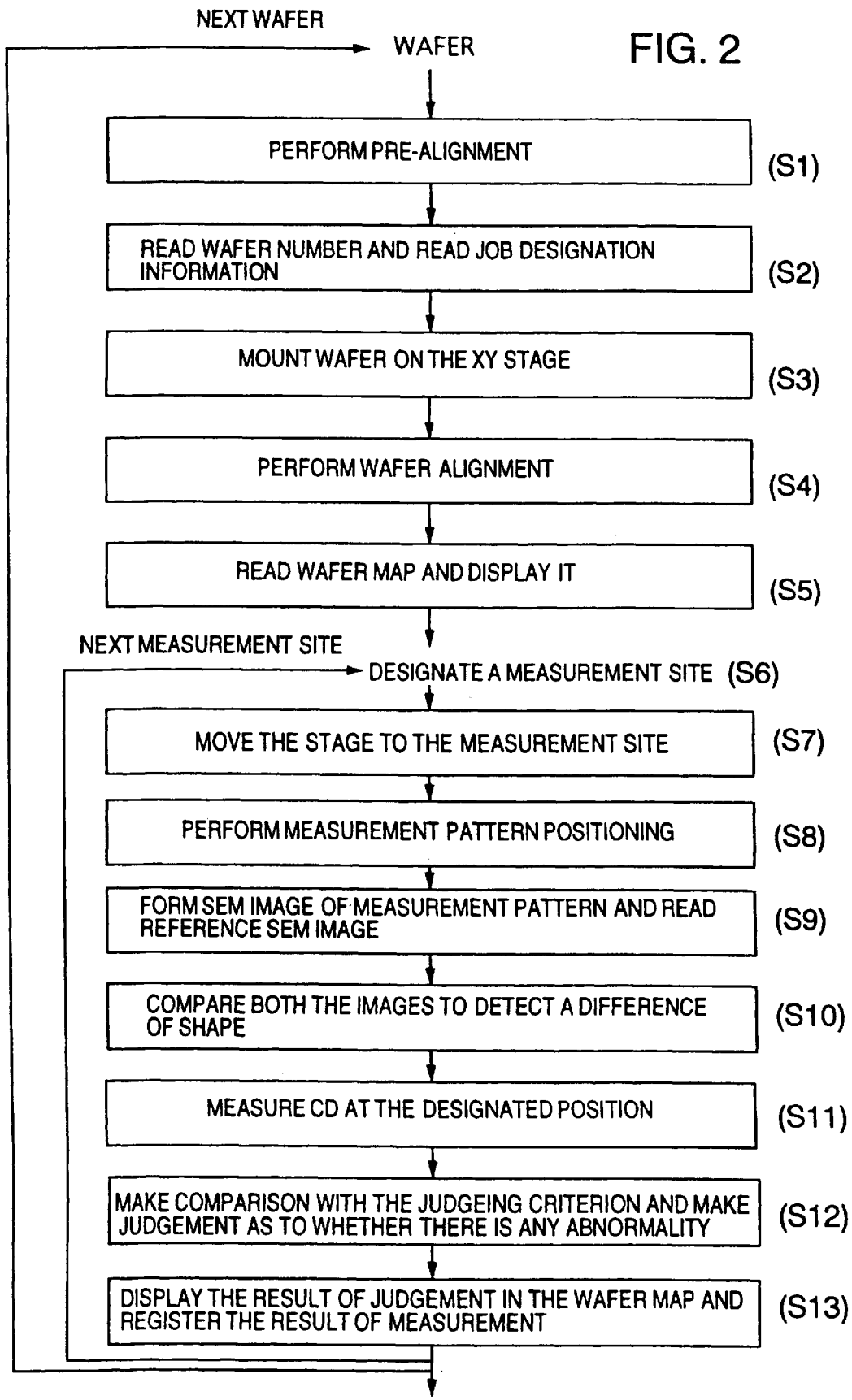

(X: DESIGNATED MEASUREMENT PLACE)

——— SHAPE OF SEM IMAGE

—·— SHAPE OF REFERENCE IMAGE 1 (UPPER LIMIT)

------ SHAPE OF REFERENCE IMAGE 2 (LOWER LIMIT)

▨ DESIGNATED MEASUREMENT PLACE 1

——— DESIGNATED MEASUREMENT PLACE 2

SAMPLE CD MEASUREMENT SYSTEM

This is a continuation of application Ser. No. 08/859,542 filed May 20, 1997.

BACKGROUND OF THE INVENTION

The present invention relates to a sample CD (critical dimension) measurement system, and particularly to a sample CD measurement system adapted for CD measurement of a device pattern in production of a semiconductor device, a magnetic storage device, an image pickup device, a display device, or the like.

Main examples of sample CD measurement systems which are the subject of the present invention include a scanning electron microscope (SEM, especially, a CD measurement SEM), a laser microscope, an i-ray microscope, a scanning interatomic force microscope, etc. The production of semiconductors will be described as an example of an typical application field of a sample CD measurement system. In the production of semiconductors, a CD measurement SEM (CD-SEM) is widely used for the CD measurement of a pattern. An example of the CD-SEM will be described below.

FIG. 1 shows the basic theory and configuration of a CD-SEM. An electron beam 2 emitted from an electron beam source 1 is narrowed by a condenser lens 3 and an objective lens 4 so as to be focused on a surface of a wafer 5 which is a sample. At the same time, the path of the electron beam 2 is deflected by a deflector 6 so that the electron beam 2 scans the surface of the wafer 5 two-dimensionally. On the other hand, secondary electrons 7 are emitted from a wafer portion exposed to the electron beam 2. These secondary electrons are detected by a secondary electron detector 8 and converted into an electric signal. The electric signal is converted into a digital signal by an A/D converter and then, the digital signal is stored in an image memory 10. The signal stored in the image memory 10 is processed by an image processor 11 so as to be used for intensity modulation of a display 12. The display 12 is scanned in the same way as the scanning of the electron beam 2 on the surface of the wafer, so that a sample image (SEM image) is formed on the display.

A pattern form is inspected with the CD-SEM, for example, by the following procedure.

A sheet 5 of test wafer taken out from a wafer cassette 13 is pre-aligned by reference to an orientation flat, a notch, or the like, of the wafer. After the pre-alignment, the wafer 5 is carried and put onto an XY stage 15 in a sample chamber 14 kept in a vacuum. The wafer 5 loaded on the XY stage 15 is wafer-aligned by using an optical microscope 16 attached to an upper portion of the sample chamber 14. Specifically, an image obtained by the optical microscope 16 is converted into an electric signal by an image pickup device such as a CCD, or the like. The electric signal is converted into a digital signal by an A/D converter 17. The digital signal is stored in the image memory 10. The signal stored in the image memory 10 is coupled to a display 12 through an image processor 11, so that the optical microscope image is displayed on the display 12. An alignment pattern formed on the wafer 5 is used for the wafer alignment. A field of view in the optical microscope image of the alignment pattern magnified by a magnification factor of the order of hundreds of times is compared with a field of view in a reference image of an alignment pattern registered in advance, so that the coordinates of the stage position are corrected to make the fields of view in the two images coincide with each other.

After the alignment, the wafer is moved on the stage to a desired measurement site. After the wafer is moved to the measurement site, a scanning electron beam is radiated onto the wafer to form an SEM image of the measurement portion. This SEM image is processed so that the CD of a pattern in a designated portion is obtained on the basis of the image intensity profile of the measurement portion.

Incidentally, the storage/reading of the image signal, the processing of the image signal, and so on, are controlled by a computer and controller 18.

As the pattern becomes finer and denser, the needs of measuring not only the CD of a line pattern or a circular hole pattern but also the CD of an irregular curved pattern increase. Not only this makes it difficult to perform positioning of the designated measurement point accurately but this also raises a requirement to measure an oblique shape in an oblique direction, for example, as represented by the designated measurement site 1 in FIG. 4.

SUMMARY OF THE INVENTION

An object of the present invention is to provide a sample CD measurement system adapted for measuring the CD of a measurement portion accurately even in the case where the shape of the measurement portion and the measuring direction are arbitrary.

According to the present invention, a sample CD measurement system for generating an image of a measurement portion of a sample is provided to measure the CD of the measurement portion of the sample on the basis of the image. A measurement reference image corresponding to the measurement portion is registered in the sample CD measurement system in advance so that the measurement reference image thus registered is read out and compared with the generated image of the measurement portion to obtain a difference in shape between the image of the measurement portion and the measurement reference image on the basis of a result of the comparison to thereby obtain the CD of the measurement portion on the basis of the difference in shape.

BRIEF DESCRIPTION OF THE DRAWINGS

FIG. 2 is a flow chart of CD measurement as an example in a sample CD measurement system according to the present invention.

DETAILED DESCRIPTION

Figure 1:
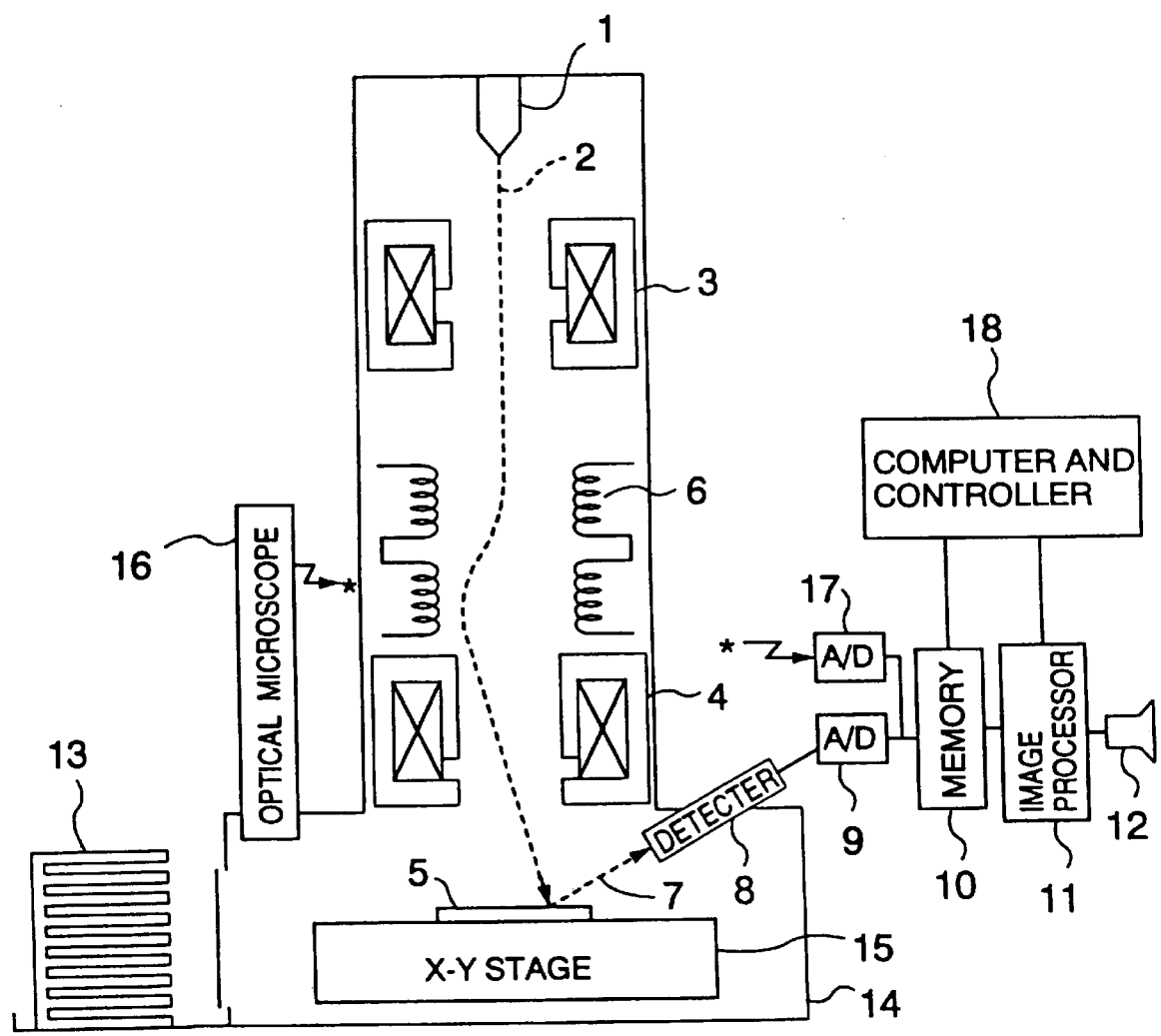
FIG. 1 is a conceptual view of a CD-SEM for explaining the present invention and the prior art.

The hardware configuration of a sample CD measurement system according to the present invention is the same as that shown in FIG. 1, and the description thereof will not be repeated.

In FIG. 2, an example of an operating procedure according to the present invention is shown in steps S1 to S13. A sheet of measurement wafer 5 taken out from wafer cassette 13 is pre-aligned by reference to an orientation flat, a notch, or the like, formed in the wafer (S1). After the pre-alignment, a wafer number formed on the wafer is read by a wafer number reader (not shown) (S2). The wafer number is peculiar to the wafer. Job designation information (a recipe) registered in a computer and controller 18 in advance corresponding to the wafer is read by reference to the read wafer number (S2). In the recipe, a procedure and conditions for measuring the wafer are defined. The operation after that is carried out automatically or semi-automatically on the basis of the recipe.

After the recipe is read, the wafer 5 is carried to and mounted on an XY stage 15 in a sample chamber 14 which is kept in a vacuum (S3). The wafer 5 mounted on the XY stage 15 is wafer-aligned by use of an optical microscope 16 attached on an upper surface of the sample chamber 14 (S4). The wafer alignment is performed by use of an alignment pattern formed on the wafer 5 in order to correct a coordinate system of the position of a pattern on the wafer relative to a coordinate system of the position on the XY stage. An optical microscope image of the alignment pattern magnified to the order of hundreds of times is compared with a wafer alignment reference image for that particular recipe which is registered in the computer and controller 18 and stored in an image memory 10 in advance. The coordinates of the position of the stage are corrected on the basis of the comparison so as to make a field of view in the optical microscope image coincide with a field of view in the wafer alignment reference image.

After the wafer alignment, a wafer map corresponding to the wafer is read from the computer and controller 18 and displayed on a display (S5). In the wafer map, the history of the wafer such as necessary measurement sites, processing situation, process QC (PQC) results, etc. is shown. An operator designates a site to be measured, selecting from measurement sites displayed in the wafer map (S6). The coordinates of the designated measurement site are registered in the computer and controller 18 so as to belong to the recipe. The registered coordinates of the measurement site are read and the wafer 5 is moved by the movement of the stage so that the measurement portion comes just under the electron beam (S7). After the movement, the scanning electron beam is radiated onto the measurement portion so that a relatively low magnified SEM image is formed. The low magnified SEM image is used for positioning the measurement pattern in the same manner as in the alignment operation. The low magnified SEM image is compared with the measurement pattern positioning reference SEM image which is stored in the image memory 10 in advance correspondingly to the measurement portion so as to belong to the recipe. The region of scanning of the electron beam is adjusted finely so that the field of view in the SEM image coincides with the field of view in the positioning reference SEM image (S8). In the positioned wafer, the measurement pattern located in the measurement portion is located substantially in the center of the display screen, that is, just under the electron beam.

Figure 3A:
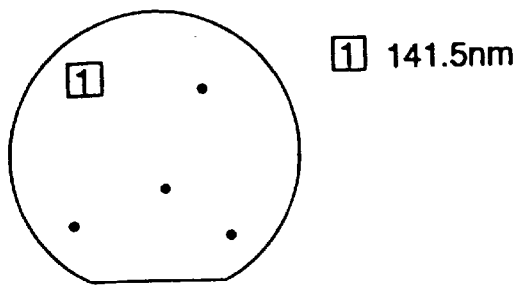
FIGS. 3A, 3B and 3C are schematic views showing measurement sites on a wafer on the basis of the CD measurement flow in FIG. 2.
Figure 3B:
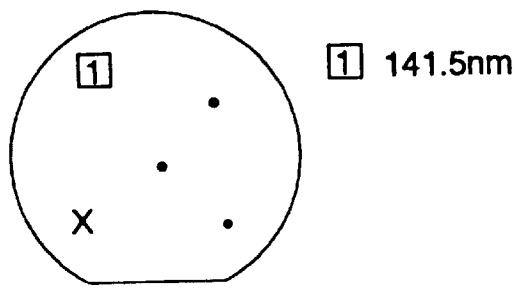
Figure 3C:
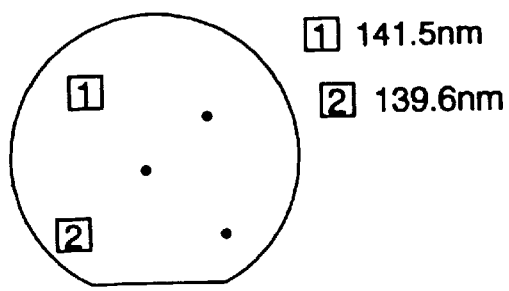

In this state, a highly magnified SEM image of the measurement pattern is formed (S9). After the highly magnified SEM image is formed, a measurement reference SEM image registered in the computer and controller 18 correspondingly to the measurement pattern so as to belong to the recipe is read (S). Comparison in shape between the measurement pattern SEM image and the measurement reference SEM image and detection of the difference in shape therebetween are carried out (S10). FIGS. 3A, 3B and 3C show examples of the wafer map displayed in the steps S5, S6 and S12 in FIG. 2. FIG. 3A shows a wafer shape having an orientation is flat on its lower side. In FIG. 3A, dots express necessary measurement sites and it is indicated that the data in the point designated by the reference numeral 1 is 141.5 nm (step S5). FIG. 3B shows a state (step S6) in which an arbitrary point is selected by the X marker from the necessary measurement sites expressed by the dots. In FIG. 3C, the measurement result 139.5 nm measured at measurement point selected by X marker is displayed at the position designated by reference numeral 2 on the wafer map (step S13).

The shape used herein is defined by the following method.

The comparison in shape is achieved by a pattern matching method in which a measurement pattern SEM image actually measured and a measurement reference SEM image are matched with each other so that the shapes of the two images coincide with each other best.

The CD of a pattern at the designated point in the measurement pattern is measured on the basis of the quantity of displacement between the matched two images, that is, the difference in shape between the matched two images (S11). A result of the CD measurement is compared with the judging criterion which is registered in the computer and controller 18 in advance. A judgment is made on the basis of the comparison as to whether the result of the CD measurement is abnormal or not (S12). After the judgment, the wafer map is indicated on the display again. Then, the result of the abnormality judgment is displayed on the designated measurement site in the wafer map, so that registration of the measurement result in a data base is performed and, if necessary, the measurement pattern SEM image is stored in an image file (S13).

In this manner, a procedure concerning one measurement site is completed. If there remains any site to be measured, a new measurement site is designated on the wafer map and the procedure after the step S6 in FIG. 2 is repeated.

In this manner, the procedure of measuring one sheet of wafer is completed. If there remain a plurality of measurement wafers in the wafer cassette, the next wafer is taken out from the wafer cassette and then the same operation is repeated in accordance with the operating procedure in FIG. 2.

The SEM image is expressed by the change of luminance of every pixel. If luminance is digitized to be expressed in gradation, the pattern can be simulated as a mountain on a contour map. While attention is paid to this, for example, the shape of the pattern is determined as follows.

(1) The shape is defined by a contour line generated by a peak or bottom gradation level.
(2) A specific gradation level is designated so that the shape is defined by a contour line determined on the basis of this level.
(3) The change of gradation is expressed by a maximum inclined line, an approximate line, or the like, so that the shape is defined by an intersection curve between this line and the ground level.
(4) The profile of the gradation change of the measurement pattern is compared with that of the measurement reference SEM image so that a comparison curve of the shape is defined when the shapes of the two profiles coincide with each other best. For digitizing luminance, the image processor 11 is controlled by the computer and controller 18 so that image parameters such as luminance, contrast, etc. can be changed independently with respect to the SEM image of the measurement portion and the measurement reference image.

Figure 4:
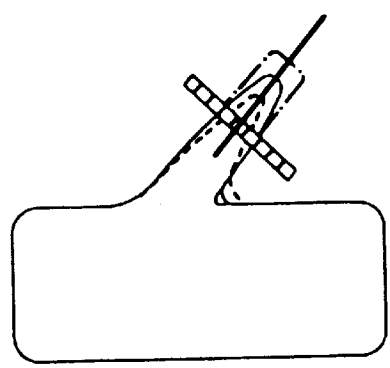
FIG. 4 is an explanatory view showing the case where the measurement of two sites is designated so that two measurement reference images are made to correspond to one SEM image.

A plurality of measurement reference images can be made to correspond to one SEM image. The use of two measurement reference images makes it possible to designate upper and lower limits of the shape as shown in FIG. 4.

Figure 5:
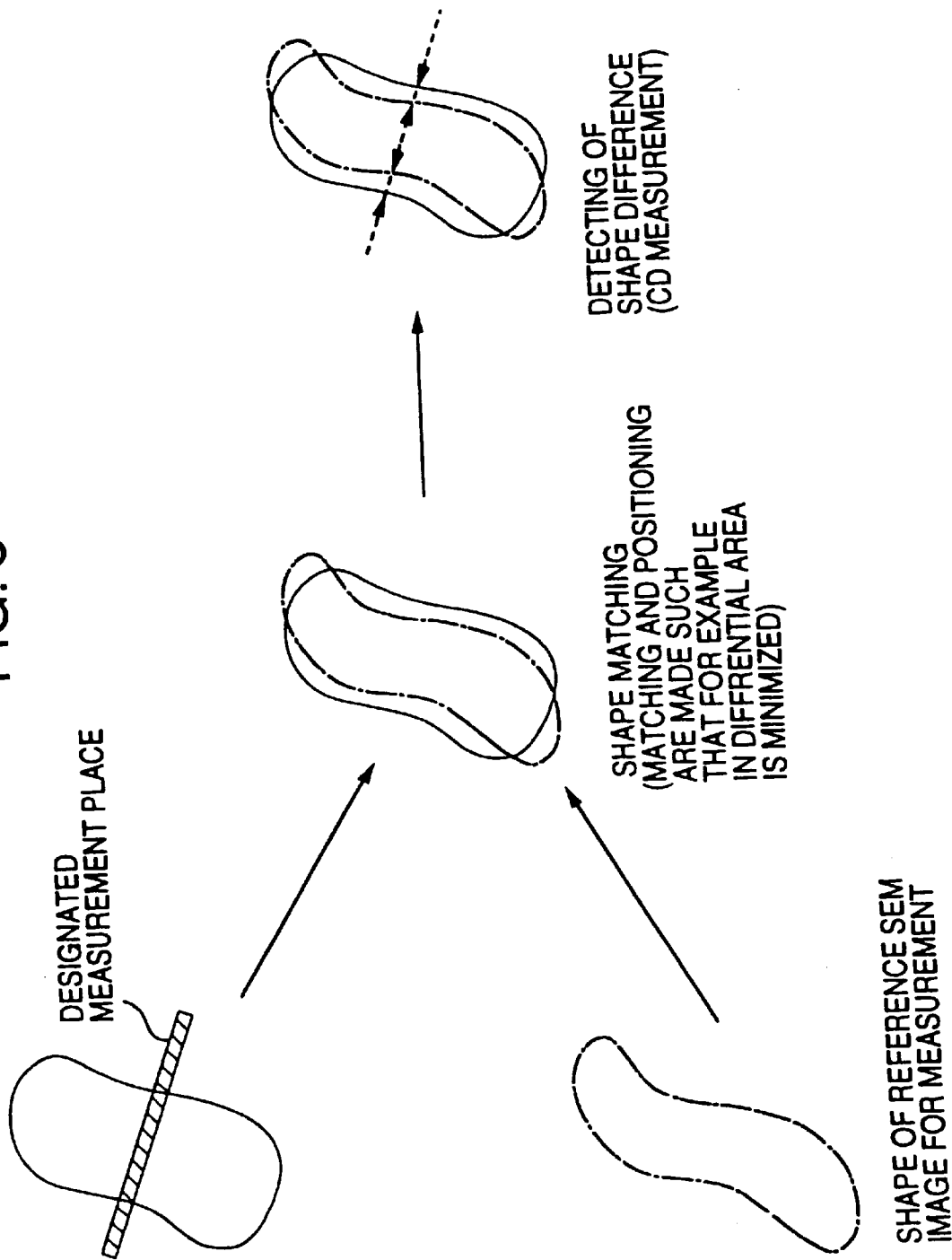
FIG. 5 is a schematic view showing the case where the shape of an SEM image measured actually is compared with the shape of a reference SEM image.

For example, the detection of the difference in shape, that is, the measurement of the CD of the pattern is carried out as shown in FIG. 5. After the shape of the SEM image is compared with the shape of the reference SEM image, the SEM image is moved in a direction indicated by the designated position so that the CD of the designated portion of the SEM image or the difference in CD between the SEM image and the reference SEM image is measured on the basis of the distance of movement of the SEM image at which the shape of the SEM image touches the shape of the measurement reference SEM image. Alternatively, as shown in FIG. 3, the measurement of a plurality of portions can be designated correspondingly to one SEM image. According to this example, a judgment can be made easily as to whether the two images coincide with other or not.

Although this embodiment has shown a method in which an operator designates a desired position from measurement sites displayed on the wafer map to measure the desired position manually, the invention can be also applied to a method in which the measurement site is moved to a position designated by the recipe so that measurement and judgment are repeated automatically.

The criterion for judging abnormality may be registered in advance in the computer and controller 18 so that the abnormality of the result of the CD measurement is judged automatically on the basis of the criterion to give an alarm to the operator, or the like.

If the measurement data and SEM image of the abnormal portion are read at the same time as the alarm, confirmation or clearing up the cause is made easily.

The reference image may be registered newly or renewed in the middle of the measurement. Although this embodiment has shown the case where an image registered in the computer and controller 18 before the measurement is used as the reference image, the registration of an image of the portion of one and the same pattern in adjacent chips or adjacent cells may be renewed as the measurement reference SEM image in the middle of the measurement if the luminance and contrast of the measurement reference SEM image registered in advance are widely different from those of the measurement pattern SEM image.

In the case where a charged particle beam such as an electron beam, an ion beam, or the like, is used with respect to a poorly conductive sample requiring a large time for saturating charge-up, the charged particle beam is preferably radiated for a predetermined time so that charge-up is saturated before the SEM image used for the measurement is taken in.

Incidentally, the term "charge-up" means a phenomenon in which electric charges are accumulated on a surface of an electrically insulating material when a charged particle beam is radiated onto the electrically insulating material.

Figure 6:
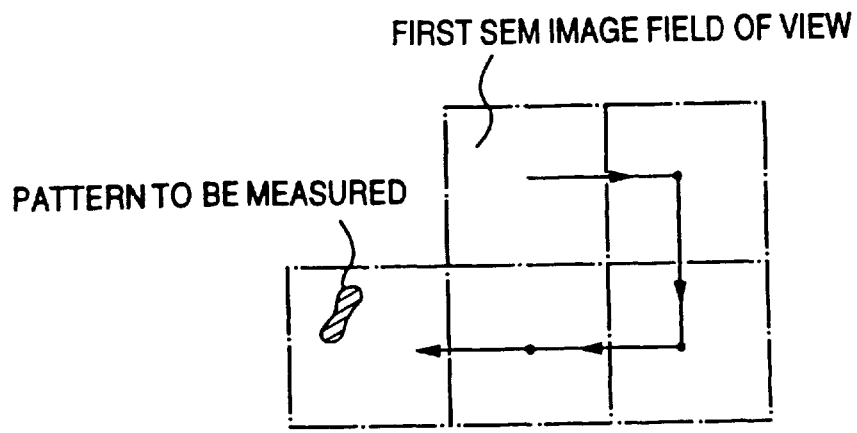
FIG. 6 is a conceptual view showing the case where the periphery of a measurement portion is searched when the measurement portion cannot be found.

Although this embodiment has shown a method in which alignment is performed on the basis of a low magnification SEM image before the measurement pattern is positioned on the basis of a highly magnified SEM image, the present invention may be also applied to a method in which the designated measurement point is retrieved on the basis of a highly magnified SEM image without alignment so that a function capable of searching the periphery of the measurement portion is given as shown in FIG. 6 when the measurement portion cannot be found.

Although this embodiment has shown the case where an XY stage is used, the CD measurement can be performed in a state in which the sample is inclined and the XY stage is replaced by an XYT (T expresses an inclination) stage.

Although this embodiment has shown the case where an electron beam is used for forming an image, the invention may be applied to the case where the electron beam is replaced by an ion beam, a light beam, a mechanical probe, or the like.

Although this embodiment has shown the case where one pixel corresponds to one probe, the invention may be applied to a method in which an image is formed by multiple probes or from multiple pixels.

Although this embodiment has shown the case where a scanning image is used, the invention may be applied to the case where the scanning image is replaced by a projection image formed by an image-forming optical system.

Figure 7:
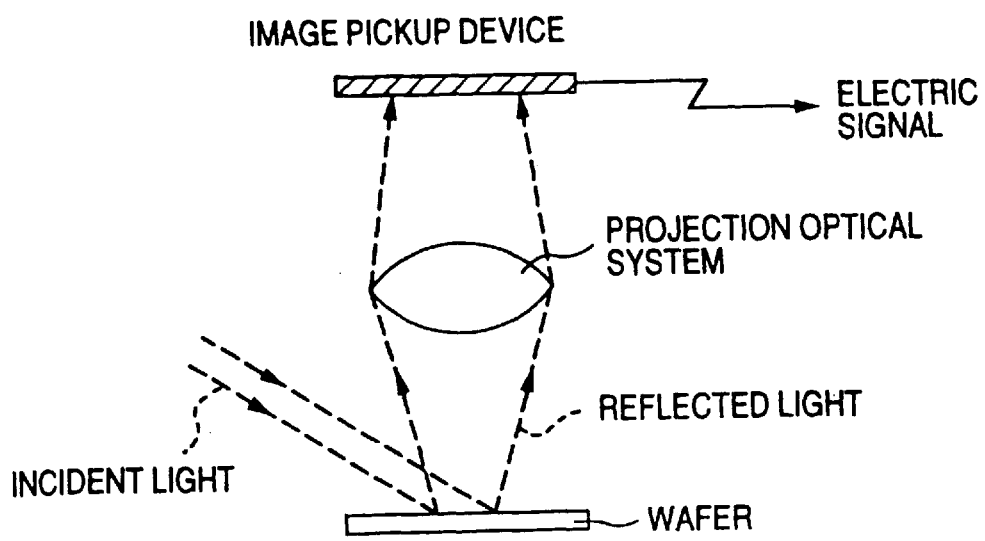
FIG. 7 is a schematic view showing an embodiment in which an image-forming optical system is used instead of the scanning image.

In this case, the image is formed, for example, as shown in FIG. 7. That is, incident light is radiated onto a measurement pattern of a surface of a wafer and light reflected from the measurement pattern is made to pass through a projection optical system so that an image is focused on an image pickup device such as a CCD, or the like. The thus focused image of the measurement pattern is converted into an electric signal by the image pickup device. The procedure after that is the same as in the case of the SEM image.

Although this embodiment has shown the case where a semiconductor wafer is observed, the semiconductor wafer may be replaced by a wafer for an image pickup device or a display device or any other sample than the wafer may be used.

It is apparent from the above description that the measurement position can be positioned accurately on the basis of comparison with the pattern shape of a reference image. It is further apparent that the CD of a pattern having an arbitrary shape and an arbitrary direction is obtained easily because the CD is obtained on the basis of the difference in shape between patterns.

As described above, in the aforementioned embodiment, there is provided a sample CD measurement system adapted for measuring the CD of a measurement portion accurately even in the case where the shape of the measurement portion and the direction of measurement are arbitrary.

What is claimed is:

1. A sample CD measurement system for generating an image of a measurement portion of a sample to measure the CD of said measurement portion of said sample on the basis of said image, comprising:

moving at least one of image of said sample including a specific pattern generated based on irradiation of a charged particle beam or light onto said sample and a specific pattern in a measurement reference image, defined in advance, so as to match the shape of both patterns; and obtaining the CD of said specific pattern in said image of said sample on the basis of a difference between the specific patterns in said image of said sample and said reference image at a measurement portion in said reference image designated in advance.

2. A sample CD measurement system according to claim 1, wherein parameters concerning said image of said measurement portion and parameters concerning said measurement reference image can be changed independently of each other.

3. A sample CD measurement system according to claim 1, wherein a plurality of images are used for aligning with said image of said measurement portion.

4. A sample CD measurement system according to claim 2, wherein a plurality of images are used for aligning with said image of said measurement portion.

5. A sample CD measurement system according to claim 1, wherein said measurement reference image is corrected on the basis of said image of said measurement portion at the time of measurement of said CD.

6. A sample CD measurement system according to claim 2, wherein said measurement reference image is corrected on the basis of said image of said measurement portion at the time of measurement of said CD.

7. A sample CD measurement system according to claim 3, wherein said measurement reference image is corrected on the basis of said image of said measurement portion at the time of measurement of said CD.

8. A sample CD measurement system according to claim 1, wherein not only a sample number is written on said sample in advance but also job information for performing a measuring job corresponding to said sample is registered in said CD measurement system in advance so that said sample number written on said sample is read at the time of measurement of said sample, said job information is read by reference to said read sample number and said measuring job is performed on the basis of said read job information.

9. A sample CD measurement system according to claim 2, wherein not only a sample number is written on said sample in advance but also job information for performing a measuring job corresponding to said sample is registered in said CD measurement system in advance so that said sample number written on said sample is read at the time of measurement of said sample, said job information is read by reference to said read sample number and said measuring job is performed on the basis of said read job information.

10. A sample CD measurement system according to claim 3, wherein not only a sample number is written on said sample in advance but also job information for performing a measuring job corresponding to said sample is registered in said CD measurement system in advance so that said sample number written on said sample is read at the time of measurement of said sample, said job information is read by reference to said read sample number and said measuring job is performed on the basis of said read job information.

11. A sample CD measurement system according to claim 4, wherein not only a sample number is written on said sample in advance but also job information for performing a measuring job corresponding to said sample is registered in said CD measurement system in advance so that said sample number written on said sample is read at the time of measurement of said sample, said job information is read by reference to said read sample number and said measuring job is performed on the basis of said read job information.

12. A sample CD measurement system according to claim 1, wherein not only said sample is pre-aligned before the measurement of said CD but also a reference image for alignment of said sample is registered in said CD measurement system in advance so that an alignment image corresponding to said reference image for alignment of said sample is formed and compared with said alignment reference image to make the two images coincide with each other to thereby perform the alignment of said sample.

13. A sample CD measurement system according to claim 1, wherein: a measurement portion of said sample is designated so that said designated measurement portion is moved to a measurement site of said CD measurement system; and a measurement site positioning reference image corresponding to said measurement portion is registered in said CD measurement system in advance so that a lower magnified image than said generated image of said measurement portion is formed and compared with said measurement site positioning reference image to thereby perform positioning of said measurement portion to a center of a field of view.

14. A sample CD measurement system according to claim 13, wherein a criterion for judging abnormality concerning a result of the CD measurement of said measurement portion of said sample is registered in said CD measurement system in advance so that a judgment is made on the basis of said criterion as to whether the result of said CD measurement is abnormal or not and an alarm is generated automatically when the result of said CD measurement is abnormal.

15. A sample CD measurement system according to claim 14, wherein said image of said measurement portion of said sample is an SEM image after said sample is exposed to a charged particle beam for a predetermined time.

16. A sample CD measurement system for generating an image of a measurement portion of a sample to measure the CD of said measurement portion of said sample on the basis of said image, comprising:

establishing a measurement reference image having a measurement portion at a specific portion of a pattern in said sample CD measurement system in advance;

reading out said measurement reference image thus registered;

generating an image of a corresponding pattern of said sample based on irradiation of a charged particle beam or light onto said sample;

moving at least one of said image of said sample and said measurement reference image, so as to match the shapes of their corresponding patterns; and obtaining the CD of said measurement portion on the basis of the difference in dimensions between said measurement reference image and said generated image at said measurement portion of said sample.

17. A sample CD measurement system according to claim 16, wherein parameters concerning said image of said measurement portion and parameters concerning said measurement reference image can be changed independently of each other.

18. A sample CD measurement system according to claim 16, wherein a plurality of images are used for aligning with said image of said measurement portion.

19. A sample CD measurement system according to claim 17, wherein a plurality of images are used for aligning with said image of said measurement portion.

20. A sample CD measurement system according to claim 16, wherein said measurement reference image is corrected on the basis of said image of said measurement portion at the time of measurement of said CD.

21. A sample CD measurement system according to claim 17, wherein said measurement reference image is corrected on the basis of said image of said measurement portion at the time of measurement of said CD.

22. A sample CD measurement system according to claim 18, wherein said measurement reference image is corrected on the basis of said image of said measurement portion at the time of measurement of said CD.

23. A sample CD measurement system according to claim 16, wherein not only a sample number is written on said sample in advance but also job information for performing a measuring job corresponding to said sample is registered in said CD measurement system in advance so that said sample number written on said sample is read at the time of measurement of said sample, said job information is read by reference to said read sample number and said measuring job is performed on the basis of said read job information.

24. A sample CD measurement system according to claim 17, wherein not only a sample number is written on said sample in advance but also job information for performing a measuring job corresponding to said sample is registered in said CD measurement system in advance so that said sample number written on said sample is read at the time of measurement of said sample, said job information is read by reference to said read sample number and said measuring job is performed on the basis of said read job information.

25. A sample CD measurement system according to claim 18, wherein not only a sample number is written on said sample in advance but also job information for performing a measuring job corresponding to said sample was registered in said CD measurement system in advance so that said sample number written on said sample is read at the time of measurement of said sample, said job information is read by reference to said read sample number and said measuring job is performed on the basis of said read job information.

26. A sample CD measurement system according to claim 19, wherein not only a sample number is written on said sample in advance but also job information for performing a measuring job corresponding to said sample is registered in said CD measurement system in advance so that said sample number written on said sample is read at the time of measurement of said sample, said job information is read by reference to said read sample number and said measuring job is performed on the basis of said read job information.

27. A sample CD measurement system according to claim 16, wherein not only said sample is pre-aligned before the measurement of said CD but also a reference image for alignment of said sample is registered in said CD measurement system in advance so that an alignment image corresponding to said reference image for alignment of said sample is formed and compared with said alignment reference image to make the two images coincide with each other to thereby perform the alignment of said sample.

28. A sample CD measurement system according to claim 16, wherein: a measurement portion of said sample is designated so that said designated measurement portion is moved to a measurement site of said CD measurement system; and a measurement site positioning reference image corresponding to said measurement portion is registered in said CD measurement system in advance so that a lower magnified image than said generated image of said measurement portion is formed and compared with said measurement site positioning reference image to thereby perform positioning of said measurement portion to a center of a field of view.

29. A sample CD measurement system according to claim 28, wherein a criterion for judging abnormality concerning a result of the CD measurement of said measurement portion of said sample is registered in said CD measurement system in advance so that a judgment is made on the basis of said criterion as to whether the result of said CD measurement is abnormal or not and an alarm is generated automatically when the result of said CD measurement is abnormal.

30. A sample CD measurement system according to claim 29, wherein said image of said measurement portion of said sample is an SEM image after said sample is exposed to a charged particle beam for a predetermined time.

31. A sample CD measurement system for generating an image of a pattern on a sample to measure a CD of said pattern based on said image, including:
a memory for registering a measurement reference image of said pattern having a measurement portion positioned at a particular portion of said pattern in advance, and means for moving at least one of image of said sample including a corresponding pattern generated based on irradiation of a charged particle beam or light onto said sample and said reference, so as to match the shape of both patterns; and control means for obtaining said CD of said pattern image on said sample by reading out said registered measurement reference image from said memory, aligning said pattern of measurement reference image with a pattern corresponding to said pattern of image of said measurement portion so as to much the shape of the both patterns with said means for moving, and obtaining said CD on the basis of the difference between said measurement reference image pattern and said image of said pattern on said sample.

32. A method for measuring a sample CD by generating an image of a portion to be measured on a sample for measuring a CD of said portion to be measured based on said image; comprising the steps of:

reading out a measurement reference image corresponding to said portion to be measured, said measurement reference image being registered in advance;

aligning said read-out measurement reference image with said image of said portion to be measured so as to match a particular pattern by moving at least one of an image of said sample including said particular pattern generated based on irradiation of a charged particle beam or light onto said sample and a corresponding particular pattern in said measurement reference image; and obtaining the CD of said measurement portion on the basis of the difference in pattern between said measurement reference image and said image of said measurement portion of said sample.

33. In a sample CD measurement system including means for irradiating a charged particle beam or light onto said sample, detection means for detecting charged particle or light obtained by irradiating said charged particle beam or light onto said sample, and image forming means for forming an image of a specific region of said sample on the basis of said output of said detection means, said system comprising:

a memory for storing image information including a specific pattern and measured portions covering at least two outlines of said specific pattern;

means for moving said specific pattern in said image information stored in said memory or at least one of said patterns in said image formed by said image forming means so as to match the shape of both patterns; and means for measuring a distance between said two outlines formed by said image forming means on the basis of a difference in dimensions between said two outlines of said aligned specific patterns and differences in dimensions of said two outlines corresponding to said measured position of said pattern formed by said image forming means.

34. In a sample CD measurement system including means for irradiating charged particle beam or light to said sample, detection means for detecting charged particle or light obtained by irradiating said charged particle beam or light to said sample, and image forming means for forming an image of a specific region of said sample on the basis of said output of said detection means; said system comprising:

memory for storing image information including a first pattern and measured portions covering at least two outlines in said first pattern;

means for pattern matching between said first pattern in image memory stored in said memory and said second pattern in said image pattern formed in said image forming means;

moving means for moving at least one of said image stored in said memory or image formed by said image forming means in said measuring direction from a point where the outlines cross with each other to a point where the outlines cross again in said measuring portion of said first and second patterns; and means to measure in said measurement portion of said second pattern on the basis of moving distance of said first or second pattern moved by said moving means.

* * * * *

UNITED STATES PATENT AND TRADEMARK OFFICE
CERTIFICATE OF CORRECTION

PATENT NO. : 6,157,451
DATED : December 5, 2000
INVENTOR(S) : Fumio Mizuno

Page 1 of 1

It is certified that error appears in the above-identified patent and that said Letters Patent is hereby corrected as shown below:

<u>Title page,</u>
Before "Related U.S. Application Data" insert
-- [30] Foreign Application Priority Data
May 21, 1996 [JP] Japan..................08-125592 --.

Signed and Sealed this

Twenty-eighth Day of August, 2001

Attest:

NICHOLAS P. GODICI
*Attesting Officer*  *Acting Director of the United States Patent and Trademark Office*